(12) United States Patent
Ku et al.

(10) Patent No.: US 6,982,197 B2
(45) Date of Patent: Jan. 3, 2006

(54) METHOD AND APPARATUS FOR BUILDING UP LARGE SCALE ON CHIP DE-COUPLING CAPACITOR ON STANDARD CMOS/SOI TECHNOLOGY

(75) Inventors: Joseph W. Ku, Palo Alto, CA (US); Paul Vande Voorde, San Mateo, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 606 days.

(21) Appl. No.: 10/067,317

(22) Filed: Feb. 7, 2002

(65) Prior Publication Data

US 2003/0148578 A1  Aug. 7, 2003

(51) Int. Cl.
*H01L 21/8242* (2006.01)
*H01L 21/20* (2006.01)

(52) U.S. Cl. .................................. 438/239; 438/393
(58) Field of Classification Search ............... 438/239, 438/393, 396, 397; 257/306, 307, 309, 534
See application file for complete search history.

(56) References Cited

U.S. PATENT DOCUMENTS

| | | | | |
|---|---|---|---|---|
| 4,410,905 A | * | 10/1983 | Grabbe | 257/668 |
| 5,656,834 A | * | 8/1997 | Grzyb et al. | 257/207 |
| 6,496,053 B1 | * | 12/2002 | Daubenspeck et al. | 327/525 |
| 6,653,681 B2 | * | 11/2003 | Appel | 257/307 |
| 6,830,650 B2 | * | 12/2004 | Roche et al. | 156/345.24 |

* cited by examiner

*Primary Examiner*—Amir Zarabian
*Assistant Examiner*—Pamela E Perkins
(74) *Attorney, Agent, or Firm*—Richard P. Lange

(57) ABSTRACT

The apparatus and method for forming de-coupling capacitors on top of SOC VLSI chip. The introduced large amount of de-coupling capacitor is intended to solve the power delivery problem of highly integrated and powered VLSI chip, especially in the Silicon-On-Insulator (SOI) technology. This invention proposes a design scheme which could utilize virtually unused area to build efficient de-coupling capacitors without introducing additional manufacture cost. This design scheme is especially effective when the VLSI technology is scaled down further.

19 Claims, 4 Drawing Sheets

METHOD AND APPARATUS FOR BUILDING UP LARGE SCALE ON CHIP DE-COUPLING CAPACITOR ON STANDARD CMOS/SOI TECHNOLOGY

FIELD OF THE INVENTION

This invention relates generally to a semiconductor device and in particular to improving decoupling capacitor integrated circuits built onto a memory device.

BACKGROUND OF THE INVENTION

Modern semiconductor devices including integrated circuit devices have electrically conductive leads and output drivers which are switched ON and OFF. The switching operations between no current and peak current is very rapid and may cause rapid changes in the power supply voltage and spikes within the lead circuits and die circuits. Such induced voltage and current variations cause malfunctions of the integrated circuit and may severely limit the clock speed at which the device can be satisfactorily operated. The problem is particularly relevant in devices having a large number of leads, where many leads may be simultaneously switched ON to cause a large, sudden current drain.

The goal of decoupling capacitors is to provide a condition whereby the actual ranges of voltage and current in each part of the circuit in the ON and OFF stages are relatively narrow. The de-coupling capacitor provides necessary current demands of the chip during operation. If the de-coupling capacitance is not enough, the inductance of the power delivery line might cause voltage dipping which could result in the malfunction of the chip. Currently, most of the VLSI chips rely on parasitic capacitance (i.e. N-well junction capacitance) to provide the major part of the necessary on chip de-coupling capacitance. In some highly integrated VLSI circuits where the instantaneous current demand is high, additional de-coupling capacitors are added in the surrounding area of peripheral circuitry to stable the power supply in case of heaving switching activities occurring on chip. With the increasing usage of SOI (Silicon-on-Insulator) technology, the problem of voltage dipping is particular acute, because SOI technology inherently has less parasitic capacitance.

Decoupling capacitors are frequently used in the supply rail of the on-chip cache memory blocks inside the processor chip due to high current demand during cache access from the CPU.

FIG. 1 illustrates a floor-plan view of a conventional microprocessor 10. The microprocessor 10 has logic 16 and cache circuitry 14. The logic circuitry 16 is the plurality of boxes located in the center of the figure (D MMU, LSU, IFV, FXU, DU, BP, IFV, FPU, PLL and MMU). The logic circuitry 16 includes the processor and other features involved in carrying-out processing functions of the microprocessor 10. The cache circuitry 14 is the plurality of boxes labeled "cache". The cache circuitry 14 is a well known in the art memory device. Decoupling capacitors 12 surround the logic 16 and cache 14 circuitry so as to provide load energy/storage so that the sudden current demand required by the circuitry does not result in a draining of a distant power supply (not shown). The use of decoupling capacitors 12 are well known in the art and will be discussed with greater detail with regards to FIGS. 2–4.

The coupling of the logic circuitry 16 and cache circuitry 14 in the conventional microprocessor 10 allows recently used data or instructions in the cache to be readily available to the processor, instead of requiring the processor to search for the data or instructions as in the case where distant, slow Dynamic Random Access Memory (DRAM) is used. Typically, the decoupling capacitors 12 are located along side or placed in various locations among the logic and cache circuitry, as shown in the figure. The area above the logic and cache circuitry contains metal inter-connection and inter-layer dielectric material.

In today's VLSI processor class, such as the Pentium 4 or PowerPC, the on-chip cache often occupies a large amount of chip area. In some cases, the total cache size takes more than two thirds of the chip area. Also, the processors tend to run at high frequencies, typically in the GHz range. Integrated circuits operating at such high frequencies are frequently susceptible to various forms of interference, such as, signal coupling and radio frequency interference. Typically, to avoid such interference in the memory block, a substantial amount of space above the circuit structure is left unused for signal routing, This space can be a useful location for de-coupling capacitor construction.

The prior art is replete with methods to counter this problem. Most of the prior art attempts to overcome the above stated problems by increasing the chip area to accommodate a larger de-coupling capacitance. One of the advantages of SOI technology is the small parasitic capacitance which results in small de-coupling capacitances. However, the solutions put forth by the prior art tend to be costly.

A cost effective solution has been sought for providing on chip de-coupling capacitors circuits in integrated circuits and solve the power supply and interference problems in the chip.

SUMMARY OF THE INVENTION

In one respect, the invention is a method for forming de-coupling capacitor in the area above a circuit block which is not suitable for signal routing layer due to sensitivity underneath. The method comprises the steps of forming a capacitor on an IC chip, forming a first metal layer separating the de-coupling capacitor circuit from the circuit block underneath, and forming an inter-digitated capacitance structure, such that the inter-digitated capacitance structure is etched to form a predetermined pattern of inter-digitated metal fingers, wherein a plurality of de-coupling capacitances are formed between the inter-digitated capacitance structure and first and second metal layers.

The second metal layer comprises at least one inter-digitated metal and a plurality of inter-digitated metal fingers extending there from and a dielectric material deposited between the metal fingers, wherein each of the plurality of inter-digitated metal fingers has predetermined width and thickness and is separated by a predetermined distance. The minimum space between inter-digitated fingers should be used in the VLSI technology being employed. For example in a 0.18 $\mu$m CMOS technology the minimum spacing between metal fingers is 0.28 $\mu$m and the metal thickness is 0.6 $\mu$m.

A first dielectric layer is formed on the circuit block such that the first dielectric layer has a predetermined thickness. The dielectric material of each layer could be just leveraged from regular CMOS VLSI technology. However, it is preferable to use the low dielectric material for the isolation layer such as in the inter-layer dielectric layer, and high dielectric material (i.e. $Ta_2O_5$) for the first and second dielectric layers.

A second dielectric layer is formed above the first metal plate. The first metal layer is a bottom plate which isolates the capacitor from the circuit block is formed and has a predetermined thickness.

A third dielectric layer above the second metal layer is formed and a second metal layer is formed above the second dielectric layer.

In another respect, the invention is an integrated circuit comprising a circuit block having a predetermined circuit layout, a first metal layer formed on top of the first dielectric layer which insulates the capacitor from the circuit block, and an inter-digitated capacitance structure comprising at least one metal plate and a plurality of inter-digitated metal fingers. A plurality of de-coupling capacitances is formed between the inter-digitated capacitance structure and first and second metal layers. The inter-digitated metal fingers extend from the metal plate in such a manner that the fingers are in parallel and have a predetermined separation and width. The minimum space between inter-digitated fingers is used in the VLSI technology being employed. For example, in a 0.18 $\mu$m CMOS technology the minimum metal spacing is 0.28 $\mu$m and the metal thickness is 0.6 $\mu$m.

A first dielectric layer is formed on the circuit block, such that the first dielectric layer has a predetermined thickness (0.1–1.0 $\mu$m). A second dielectric layer formed on top of the first metal layer, a third dielectric layer is formed on the second metal layer and a third metal plate is formed on the third dielectric layer.

The first metal layer is a bottom plate which isolates the capacitor from the circuit block and the first metal layer is 0.2 $\mu$m in thickness, if 0.18 um CMOS technology is used).

The dielectric material of each layer could be just leveraged from regular CMOS VLSI technology. However, if the technology is allowed, it is preferable to use the low dielectric material for the isolation layer, and high dielectric material (i.e. $Ta_2O_5$) for the capacitance layers.

In comparison to known prior art, certain embodiments of the invention are capable of achieving certain aspects, including some or all of the following: (1) the technique is easily implemented (2) at a very low cost; and (3) no need to increase the chip area to accommodate a large capacitance. Those skilled in the art will appreciate these and other advantages and benefits of various embodiments of the invention upon reading the following detailed description of a preferred embodiment with reference to the below-listed drawings.

BRIEF DESCRIPTION OF THE DRAWINGS

A more complete understanding of the invention and its advantages will be apparent from the following detailed description taken in conjunction with the accompanying drawings, wherein examples of the invention are shown and wherein.

DETAILED DESCRIPTION OF A PREFERRED EMBODIMENT

In the following detailed description, numerous specific details are set forth in order to provide a thorough understanding of the present invention. However, it will be apparent to one of ordinary skill in the art that these specific details need not be used to practice the present invention. In other instances, well known structures, interfaces, and processes have not been shown in detail in order not to unnecessarily obscure the present invention.

Decoupling capacitors and methods for fabricating such capacitors are disclosed. In the following description, numerous specific details are set forth, such as materials, thickness, processing sequences, etc., in order to provide a thorough understanding of the present invention. However, one skilled in the art would understand that the present invention may be practiced without these specific details. In other instances, well known processing steps and device structures have not been described in detail in order to avoid unnecessarily obscuring the present invention. Furthermore, although the present invention is described below as being fabricated, for example, in a CMOS integrated circuit chip, one skilled in the art would understand that the present invention could be embodied within, for example, multi-chip modules (MCM), circuit boards, or other structures that require a capacitor in close proximity to circuitry.

Figure 1:
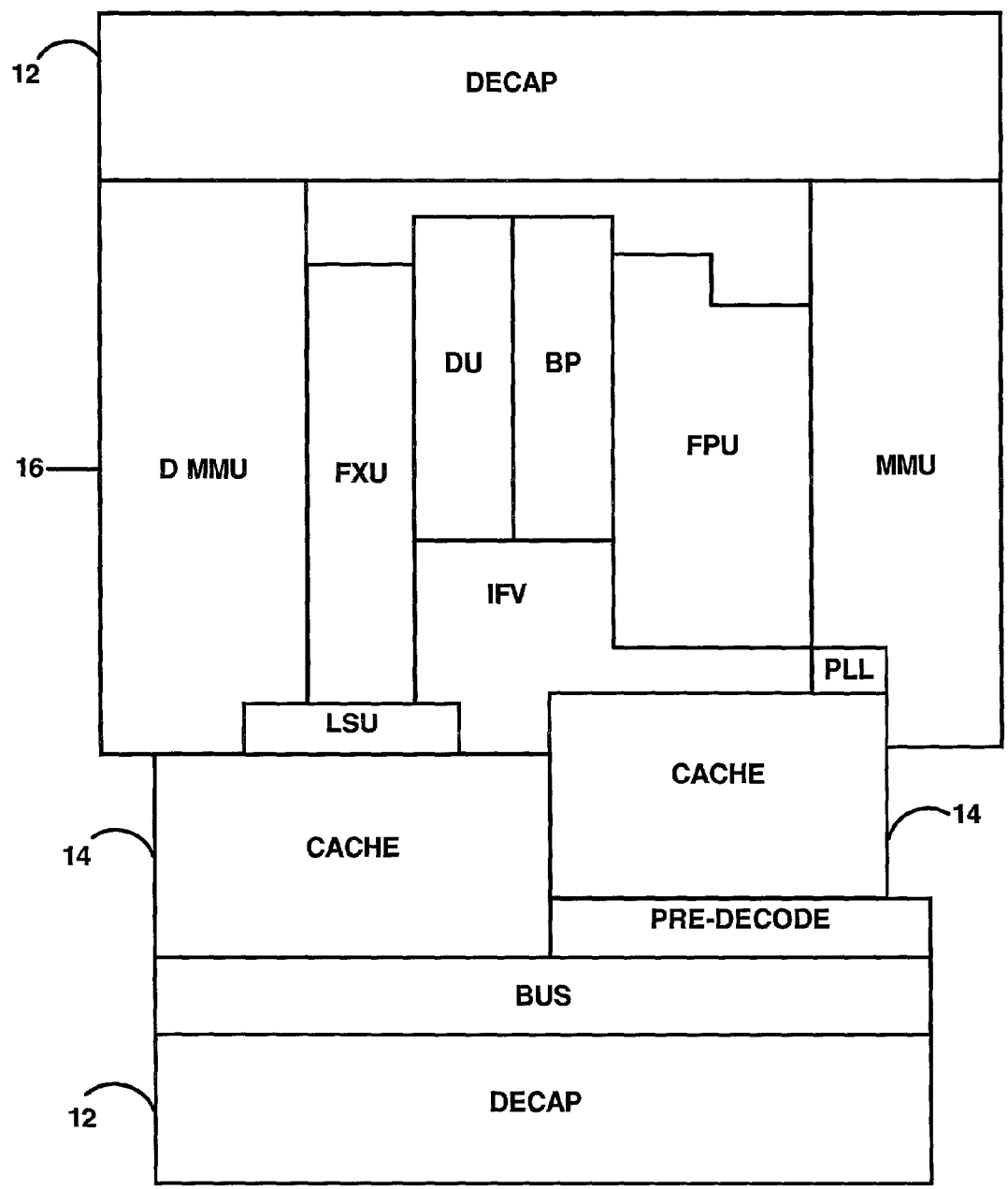
FIG. 1 is a floor-plan view illustrating a conventional microprocessor, according to the prior art.
Figure 2:
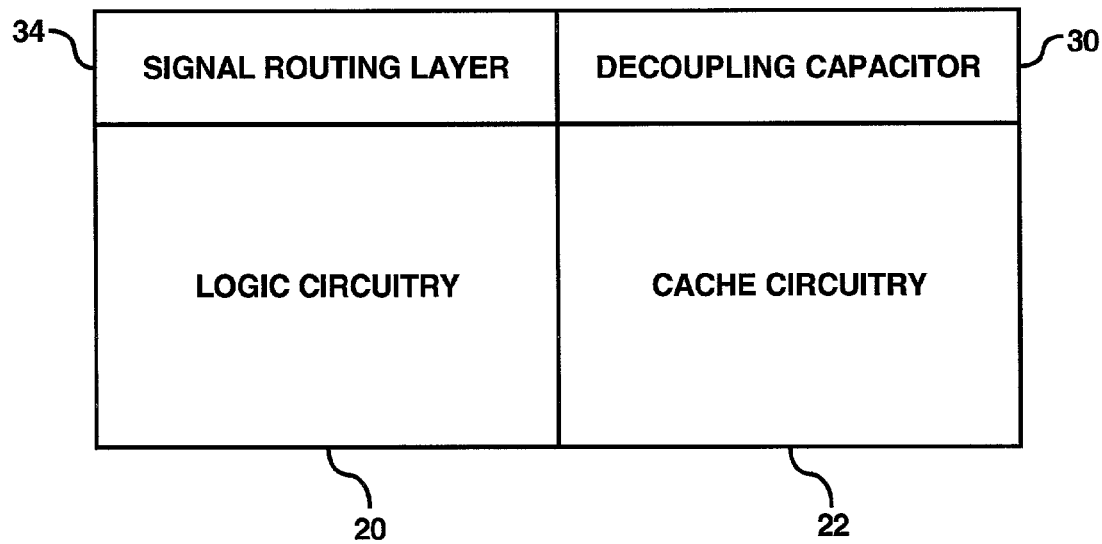
FIG. 2 is a side view illustrating the cache memory, according to an embodiment of the invention.

FIG. 2 illustrates a cross-sectional view of a System-On-a Chip (SOC) microprocessor which comprises of large cache memory block, CPU, as well as other logic functional blocks, according to the preferred embodiment of the invention. The System-On-a-Chip microprocessor includes logic circuitry 20, cache circuitry 22, signal routing metal layer 34, and decoupling capacitor 30. The logic circuitry 20 is conventional circuitry such as the CPU, and other known processing devices. The cache circuitry 22 is also conventional circuitry that comprises a cache memory device, such as memory array blocks, logic gates, and other known devices. Above the logic circuitry 20 and the cache circuitry 22 is the signal routing metal layer 34 and the decoupling capacitors 30, respectfully. The signal routing metal layer 34 is a typically a layer which electrical current is conducted, for example signal paths or interconnections between various devices or structures on in the processor. However, one of ordinary skill in the art can appreciate that the signal routing metal layer 34 can be used for many more purposes.

The decoupling capacitors 30 are located above cache circuitry 22. The decoupling capacitors 30 are preferably, located in the empty space above a cache circuitry 22 or some other type of processor circuit. This area above the cache memory array blocks were not recommended to have signal routing unless a shielded conductive layer was placed between the signal routing and the cache memory array blocks. Now, CMOS technology offers up to 8 layers of metal to be used in the signal interconnect and power routing. With the ever reducing metal spacing (now less than 0.2 $\mu$m) and thicker metal (greater than 0.6 $\mu$m in the upper layers) it is possible to construct an inter-digitated capacitor structure 200 to serve as the decoupling capacitor in the space above the cache memory. Both the decoupling capacitors 30 and the inter-digitated capacitor structure 200 will be discussed in greater detail with regards to FIGS. 3–4.

Figure 3:
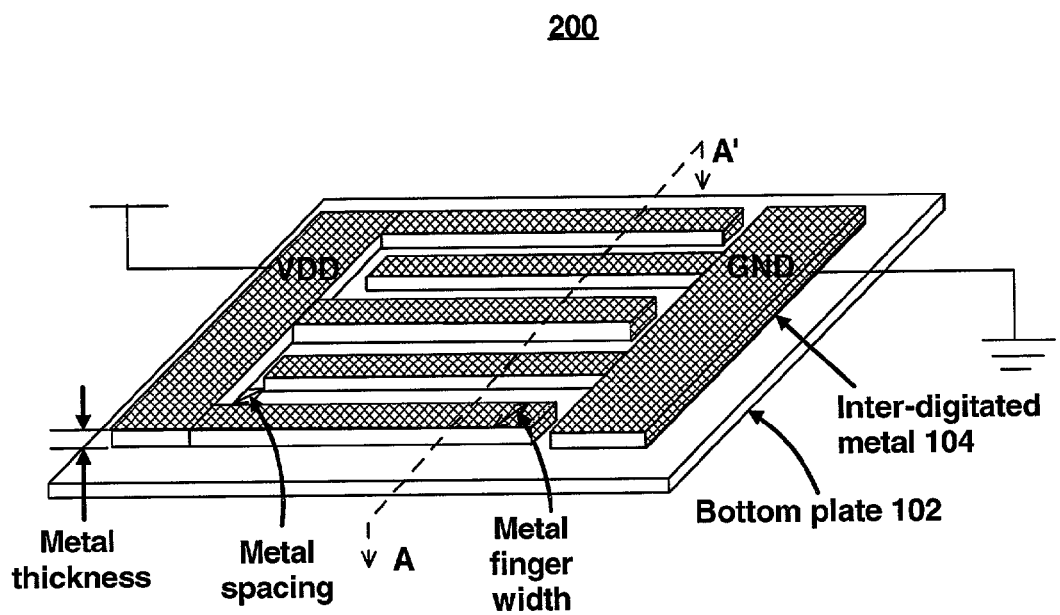
FIG. 3 is a top view illustrating the inter-digitated capacitance structure, according to an embodiment of the invention.

The structure of the inter-digitated capacitance structure 200 is illustrated in FIG. 3. The inter-digitated capacitance structure 200 is typically constructed in a previous unoccupied area above a cache memory. FIG. 3 shows the bottom metal plate 102 and a plurality of inter-digitated metal fingers 104. The top plate and dielectric layers between the bottom plate 102 and the plurality of inter-digitated metal fingers 104 are not shown. The inter-digitated capacitance structure 200 is laid out by forming two parallel metal strips on opposite sides of the plate and a plurality of fingers extending from each metal strip to a position near the opposite metal strip.

The inter-digitated metal fingers 204 have a predetermined width and thickness. The fingers 204 also are spaced apart from each other by a predetermined distance. As will be explained in further detail with regards to FIG. 4, the area between the fingers is deposited with a dielectric material (not shown). Accordingly, a plurality of capacitances is formed between the inter-digitated fingers 104, and between the inter-digitated fingers 104 and the top and bottom metal layers.

The estimation of the total capacitance obtained from a 3000 $\mu$m×3000 $\mu$m chip area (A and A') by using a standard 0.18 $\mu$m CMOS technology is illustrated as an example. This technology requires minimum spacing of 0.28 $\mu$m and the metal thickness of 0.6 $\mu$m. The capacitance of a small unit of perimeter edge is 0.2 fF per $\mu$m. In a 3000 $\mu$m×3000 $\mu$m wide space, if a 0.5 $\mu$m metal finger width is used, one could have 3000 inter-digitated fingers with 3000 $\mu$m length in each finger. The total capacitance is about 2 nF for one layer. The scheme is very advantageous for any silicon-on-chip (SOC) with large amounts of memory blocks. One of ordinary skill in the art can envision even more improvements due to narrowing spacing.

Figure 4:
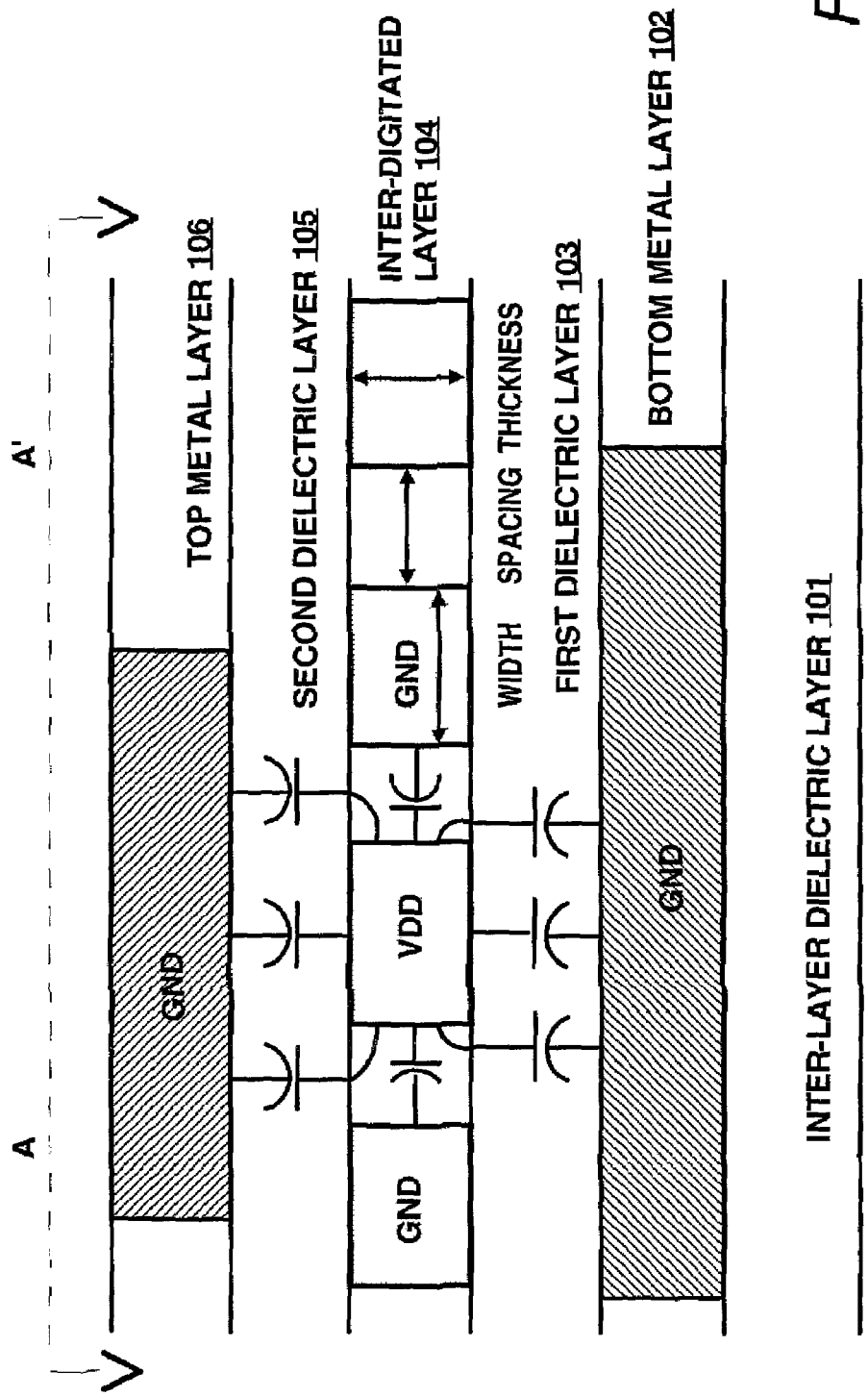
FIG. 4 is a cross-section view illustrating the inter-digitated capacitor structure, according to an embodiment of the invention.

FIG. 4 illustrates a cross-sectional view of the inter-digitated capacitor structure of the preferred embodiment of the system of the invention. The substrate (not shown) is a semiconductor wafer having device regions such as diffused junctions, gates, local interconnections, metal layers, or other device junctions or layers. In many cases, device layers, structures, or processing steps are present for reasons other than to fabricate the decoupling capacitor. For example, the substrate can be an on cache memory (SRAM) or (eDRAM).

An inter-layer dielectric material 101 is deposited over the substrate 100. The Inter-layer dielectric material 101 has a thickness in the range from approximately 0.5 $\mu$m. The dielectric material of each layer could be just leveraged from regular CMOS VLSI technology. However, if the technology is allowed, it is preferable to use the low dielectric material for the isolation layer such as in 101, and high dielectric material (i.e. $Ta_2O_5$) for the capacitance layers such as in 103 and 105. The dielectric material 101 provides electrical isolation between any previous conductive layer in the substrate 100 and the bottom metal plate 102. The bottom metal plate 102 forms the lower plate of the de-coupling capacitor. The bottom metal plate 102, also isolates the de-coupling capacitor from the substrate by reducing the signal noise which may effect the performance of the circuitry underneath the bottom metal 102. The bottom electrically conductive plate 102 can be poly-silicon, aluminum, copper, tungsten or any other similar material. One of ordinary skill in the art can easily recognize that the bottom electrically conductive plate 102 does not have to be metal. The choice of material may depend on processing or device considerations, such as processing temperature in the back-end fabrication technology, etc.

Following the deposition of the bottom metal plate 102, a first dielectric layer 103 is deposited on the bottom metal plate 102. The first dielectric layer 103 comprises electrical insulation material such as CVD, silicon dioxide or other high dielectric constant material and is deposited to a predetermined thickness based on process and device requirements.

As is well known, the capacitance between two electrodes of a capacitor is proportional to the dielectric constant of the isolation material between the plates, and inversely proportional to the separation between the plates, or between two fingers with opposite electrodes. Therefore, to increase the capacitance, each dielectric layer is made as thin, or as narrow (for the inter-digitated finger) as practical and preferably comprises a material having a high dielectric constant. Also, it is well known, that the capacitance is proportional to the area and the perimeter of the plates of the capacitor. Therefore, a desired capacitance of the decoupling capacitor can be achieved by adjusting any or all of the area of the plates, the total perimeter exposed to the two opposite electrodes (for the inter-digitated finger type), and dielectric constant of the material between the plates, depending upon process and device requirements.

Following the deposition of the dielectric layer 103, an inter-digitated layer 104 is deposited and patterned by the photolithographic process to generate inter-digitated fingers on the first dielectric layer 103. A second dielectric layer 105 is deposited on the inter-digitated layer 104. The second dielectric layer 105 is a high dielectric constant material. The second dielectric material 105 is also deposited between the voids between the inter-digitated metal fingers 105. One of ordinary skill in the art can appreciate that there could be additional decoupling capacitors built on top of the existing capacitors. Also another layer of metal as a top plate could increase the overall de-coupling capacitance.

The bottom and top metal plates 102, 106 can be completely embedded within dielectric layers. The entire structure (layers 102–106) can take the place of any preexisting insulated layer, such as an interlayer dielectric (ILD). As it is well known, a capacitor is formed from two plates (or two fingers with dielectric material separating them. Accordingly, one of ordinary skill can recognize that a plurality of de-coupling capacitors can be formed. For example, de-coupling capacitors can be formed between the top metal plate 106 and each individual inter-digitated metal finger 104. Also, a plurality of de-coupling capacitors can be formed between the individual inter-digitated metal fingers 104 themselves. Furthermore, de-coupling capacitors can also be formed between the inter-digitated metal fingers 104 and the bottom metal plate 102 as shown in FIG. 4.

Typically, the capacitor of the invention will be formed at the backend end of the microchip fabrication process, and the exact location of the capacitor will depend upon the signal routing requirement.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of forming an integrated circuit comprising the steps of:

forming a circuit function block on an IC chip; and;
forming an inter-digitated capacitance structure in an area above the circuit function block, wherein forming the inter-digitated capacitance structure comprises forming a plurality of inter-digitated metal fingers extending outward from at least one inter-digitated metal;
forming a top metal layer;
forming a bottom metal layer;
forming a dielectric material, wherein the dielectric material is deposited between the plurality of inter-digitated metal fingers; and
forming a plurality of de-coupling capacitances between the inter-digitated capacitance structure, the top metal layer and bottom metal layer, and the dielectric material.

2. The method of claim 1, wherein the step of forming a dielectric material further comprises the step of:
forming a first dielectric layer below the inter-digitated metal fingers and the bottom metal layer, wherein the first dielectric layer has a predetermined thickness.

3. The method of claim 2, wherein the first dielectric layer is a low dielectric material.

4. The method of claim 1, wherein the step of forming an inter-digitated capacitance structure further comprising the step of:
forming a second dielectric layer between the inter-digitated metal fingers and the top metal layer.

5. The method of claim 4, wherein the second dielectric layer comprises a predetermined dielectric material.

6. The method of claim 1, wherein the first metal layer is a plate which isolates the de-coupling capacitor from the circuit block.

7. The method of claim 1, wherein the step of forming an inter-digitated capacitance structure further comprising the steps of:
forming a inter-layer dielectric layer below the bottom metal layer.

8. The integrated circuit of claim 1, wherein the inter-digitated capacitance structure is formed above a cache memory.

9. A method of forming an integrated circuit comprising the steps of:
forming a circuit function block on an IC chip;
forming a first metal layer separated a decoupling capacitor circuit from the circuit function block;
forming a second metal layer; and
forming an inter-digitated capacitance structure on the first metal layer, wherein the inter-digitated capacitance structure is etched to form a predetermined pattern of inter-digitated metal fingers, wherein forming the inter-digitated capacitance structure further comprises forming a plurality of de-coupling capacitances between the inter-digitated capacitance structure, the first metal layer and the second metal layer.

10. The method of claim 9, wherein the inter-digitated capacitance structure comprises the steps of:
forming at least one inter-digitated metal finger; and
forming a dielectric layer is deposited between the at least one inter-digitated metal finger.

11. The method of claim 9, the step of forming an integrated circuit further comprising the step of:
forming a first dielectric layer above the circuit function block and the inter-digitated capacitance structure, such that the first dielectric layer has a predetermined thickness.

12. The method of claim 11, wherein the first dielectric material is a low dielectric material.

13. The method of claim 9, further comprising the steps of:
forming a second dielectric layer above the bottom metal plate.

14. The integrated circuit of claim 9, wherein the inter-digitated capacitance structure is formed above a cache memory.

15. An integrated circuit comprising:
a circuit function block having a predetermined circuit layout; and
an inter-digitated capacitance structure comprising at least one metal plate and a plurality of inter-digitated metal fingers on top of the circuit function block, wherein a plurality of de-coupling capacitances are formed between the inter-digitated capacitance structure, a first metal layer, and a second metal layer.

16. The integrated circuit of claim 15, further comprising:
a first dielectric layer formed on the circuit function block;
a third dielectric layer formed on the second metal layer; and
a third metal plate formed on the third dielectric layer.

17. The integrated circuit of claim 15, further comprising:
a second dielectric layer formed on top of the first metal layer.

18. The integrated circuit of claim 15, wherein the inter-digitated metal fingers extend from the metal plate in such a manner that the plurality of inter-digitated metal fingers are in parallel and have a predetermined separation and width.

19. The integrated circuit of claim 15, wherein the inter-digitated capacitance structure is formed above a cache memory.

* * * * *